United States Patent
Freund et al.

(10) Patent No.: US 6,168,963 B1
(45) Date of Patent: Jan. 2, 2001

(54) SYSTEM FOR ADHERING PARTS

(75) Inventors: Joseph Michael Freund, Fogelsville; George John Przybylek, Douglasville; Dennis Mark Romero, Bethleham; William Andrew Gault, Mohnton; Ralph J. Diehl, Jr., Northampton, all of PA (US)

(73) Assignee: Lucent Technologies, Inc., Murray Hill, NJ (US)

( * ) Notice: Under 35 U.S.C. 154(b), the term of this patent shall be extended for 0 days.

(21) Appl. No.: 09/336,701

(22) Filed: Jun. 21, 1999

(51) Int. Cl.[7] .................................................. H01L 21/58
(52) U.S. Cl. ............................ 438/26; 438/455; 156/381
(58) Field of Search ................................. 438/22, 25, 26, 438/28, 38, 795, 110, 118, 125, 121, 455, 456; 29/559; 414/783; 156/349, 358, 381, 382

(56) References Cited

U.S. PATENT DOCUMENTS

| | | | |
|---|---|---|---|
| 5,719,979 | * | 2/1998 | Furuyama ............................... 438/25 |
| 5,800,667 | * | 9/1998 | Kosaki et al. ......................... 156/382 |
| 5,810,926 | * | 9/1998 | Evers .................................... 156/356 |
| 5,837,562 | * | 11/1998 | Cho ...................................... 438/456 |
| 5,871,610 | * | 2/1999 | Minohoshi et al. ................. 156/362 |
| 5,876,179 | * | 3/1999 | Freund et al. ....................... 414/783 |
| 5,899,730 | * | 5/1999 | Freund et al. ....................... 438/464 |
| 5,955,771 | * | 9/1999 | Kurtz et al. .......................... 438/456 |
| 6,026,557 | * | 2/2000 | Freund et al. ....................... 269/450 |
| 6,045,321 | * | 4/2000 | Freund et al. ....................... 414/783 |
| 6,051,481 | * | 4/2000 | Kuiken et al. ....................... 438/455 |
| 6,074,934 | * | 6/2000 | Dautartas et al. ................... 438/462 |
| 6,083,811 | * | 7/2000 | Riding et al. ........................ 438/404 |
| 6,090,687 | * | 7/2000 | Merchant et al. ................... 438/456 |

* cited by examiner

Primary Examiner—Savitri Mulpuri
(74) Attorney, Agent, or Firm—Dickstein Shapiro Morin & Oshinsky, LLP

(57) ABSTRACT

A system for adhering a plurality of parts to a support film is provided. The parts are positioned between a support base with a heater and a cover membrane. The cover membrane is located beneath a sealed chamber. The chamber has an inlet through which gas is input. A downward force caused by gas pressure in the chamber causes the cover membrane to contact the parts and presses the plurality of parts against the film. A heating device heats the film to cause the parts to adhere to the film.

6 Claims, 2 Drawing Sheets

SYSTEM FOR ADHERING PARTS

FIELD OF THE INVENTION

The present invention relates to the manufacturing of semiconductor devices and, in particular, to a method and apparatus for uniform and precise handling of semiconductor laser bars.

BACKGROUND OF THE INVENTION

Semiconductor laser devices such as laser diodes and photodetectors are formed from semiconductor wafer substrates. During the fabrication of such devices, the wafer substrate undergoes a series of processes. As such, the wafer substrate is first separated or cleaved into bars of semiconductor material. The resulting laser bars may be further cleaved to form discrete semiconductor chips. Conventional methods for cleaving a wafer substrate include scribing or scoring the wafer substrate and then cleaving the substrate along the scoring line by some form of physical contact of an apparatus with the substrate.

Following the cleave process and the formation of the laser bars, each end face or facet of each laser bar is coated with an optical coating in a facet coating apparatus. A facet coat holding fixture is typically employed to retain the laser bar during the facet coating and also to transport the bar into and out of the facet coating apparatus. When the coating process is finished, the laser bars are removed and placed back on a support for further processing steps.

During the processing steps enumerated above, the semiconductor products and workpieces are supported on a mounting material such as a vinyl film. Upon completion of the facet coating step, the laser bars are removed and placed back on the mounting material. At this stage, the processed laser bars may be heated to a predetermined temperature and have a predetermined pressure applied to them to ensure uniform adherence of all bars to the mounting material.

A system has been proposed in which laser bars are initially placed onto a vinyl film and then the whole assembly is heated to an adhesion temperature. Subsequently, an individual (referred to as an operator) uses his/her fingers, or a weighted object, to manually apply pressure across each laser bar. This method cannot guarantee uniform adhesion across the film. As a consequence, parts may be lost during the downstream processing steps.

The pressure on the laser bars should be applied so that the bars are not damaged and so that the semiconductor material does not crack or split. Because of the fragility of the laser bars, breakage is a significant problem. Also, since operators use their fingers to affix the bars to the film, the pressure magnitude is not repeatable and the operators can damage the products.

Accordingly, there is a need for an improved system for handling laser bars and other products and workpieces. The improved system should provide minimum handling of the resulting laser bars by employing a gentle and stress-free assembly, uniform adhesion of the laser bars to the mounting material, uniform pressure on the mounted laser bars, and an overall reduction in the number of defects due to the cracking or splitting of the semiconductor material.

SUMMARY OF THE INVENTION

The present invention provides a method and apparatus for handling laser bars. Pressure is mechanically applied to the laser bars to uniformly adhere them to a mounting material. An object of the invention is to reduce damage to the bars by applying a uniform and constant pressure that, in turn, ensures the uniform adherence of the laser bars to the mounting material. The present invention also provides a method and apparatus for holding the laser bars during the fabrication process. The present invention applies a pressure whose magnitude is repeatable.

The above and other features and advantages of the invention are achieved by using isostatic pressure to uniformly apply a force on all the bars mounted on a section of a vinyl film. In accordance with a preferred embodiment of the present invention, the apparatus includes a base plate or a support with a heater and thermocouple, a movable cover plate with a port for pressurized gas, a sealed chamber containing a sealing structure, and an inlet for receiving a gas. In the sealed chamber, a vinyl film assembly has laser bars mounted on it. The laser bars come in contact with a flexible membrane. Pressurized gas is applied to the membrane so that it presses the laser bars against the vinyl film. The heater heats the film so that the laser bars are adhered to the film.

The present invention also provides a method in which uniform pressure is used to mount laser bars on a mounting material. The method includes the steps of positioning the film with the laser bars between a movable cover plate and a stationary base plate, locating the bars between a plastic membrane of the cover plate and the base plate, exerting pressure on the membrane such that the membrane exerts pressure on the laser bars, heating the laser bars, and causing the laser bars to adhere to the film. In a preferred embodiment of the invention, the pressure includes a force induced by gas pressure in a sealed chamber. The heater may be controlled by a thermocouple, if desired.

Additional advantages of the present invention will be apparent from the detailed description and drawings, which illustrate preferred embodiments of the invention.

DETAILED DESCRIPTION OF PREFERRED EMBODIMENTS

In the following detailed description, reference is made to various specific embodiments in which the invention may be practiced. These embodiments are described with sufficient detail to enable those skilled in the art to practice the invention, and it is to be understood that other embodiments may be employed, and that structural changes may be made.

Figure 1:
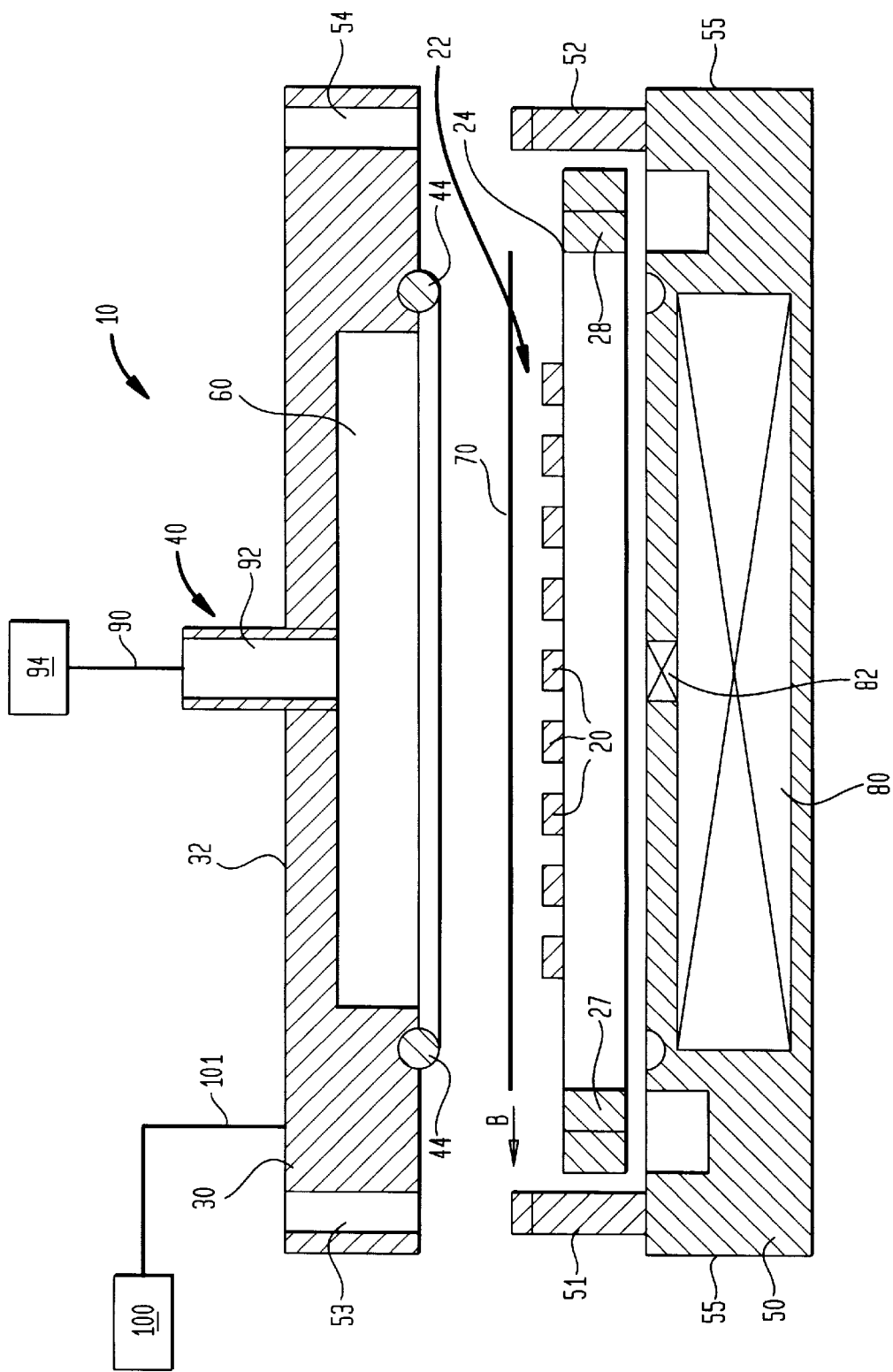
FIG. 1 is a cross-sectional view of a laser bar handling apparatus, constructed in accordance with the present invention, before force is exerted on the laser bars.

Referring now to the drawings, where like numerals designate like elements, FIG. 1 shows an apparatus 10 for handling a batch 22 of semiconductor laser bars 20. The apparatus 10 includes a cover plate 30, a base plate 50, and a sealed chamber 60.

The top 32 of the cover plate 30 has a port 40. Port 40 has an inlet 92 that communicates directly with sealed chamber 60. The cover plate 30 has an o-ring 44 for sealing the chamber 60. The o-ring 44 may be formed of a suitable elastomeric material.

The cover plate 30 comes in direct contact with the sealed chamber 60 and a flexible cover membrane 70. The laser bars 20 are located directly beneath the flexible cover membrane 70.

The laser bars 20 are supported by a mounting film 24. The mounting film 24 may be formed of a material that does not slide against itself, but that will allow a relatively frictionless movement of an object made from a different material along its surface. The mounting film 24 may be formed of polyvinyl chloride, Mylar®, Tyvek® or another suitable material.

Positioned beneath the mounting film 24 is base plate 50. Towards the outer periphery, defined by side walls 55, the base plate 50 has two holding clamps 51, 52. While two clamps are illustrated in the drawings, it should be understood that the invention is not so limited. Each of the clamps 51, 52 is positioned across from each other, and at each end of heater 80, which is embedded in base plate 50. Clamps 51, 52 contact recesses 53, 54 in cover plate 30. A thermocouple 82 is in contact with heater 80 to maintain a controlled heating of base plate 50, if desired.

Figure 2:
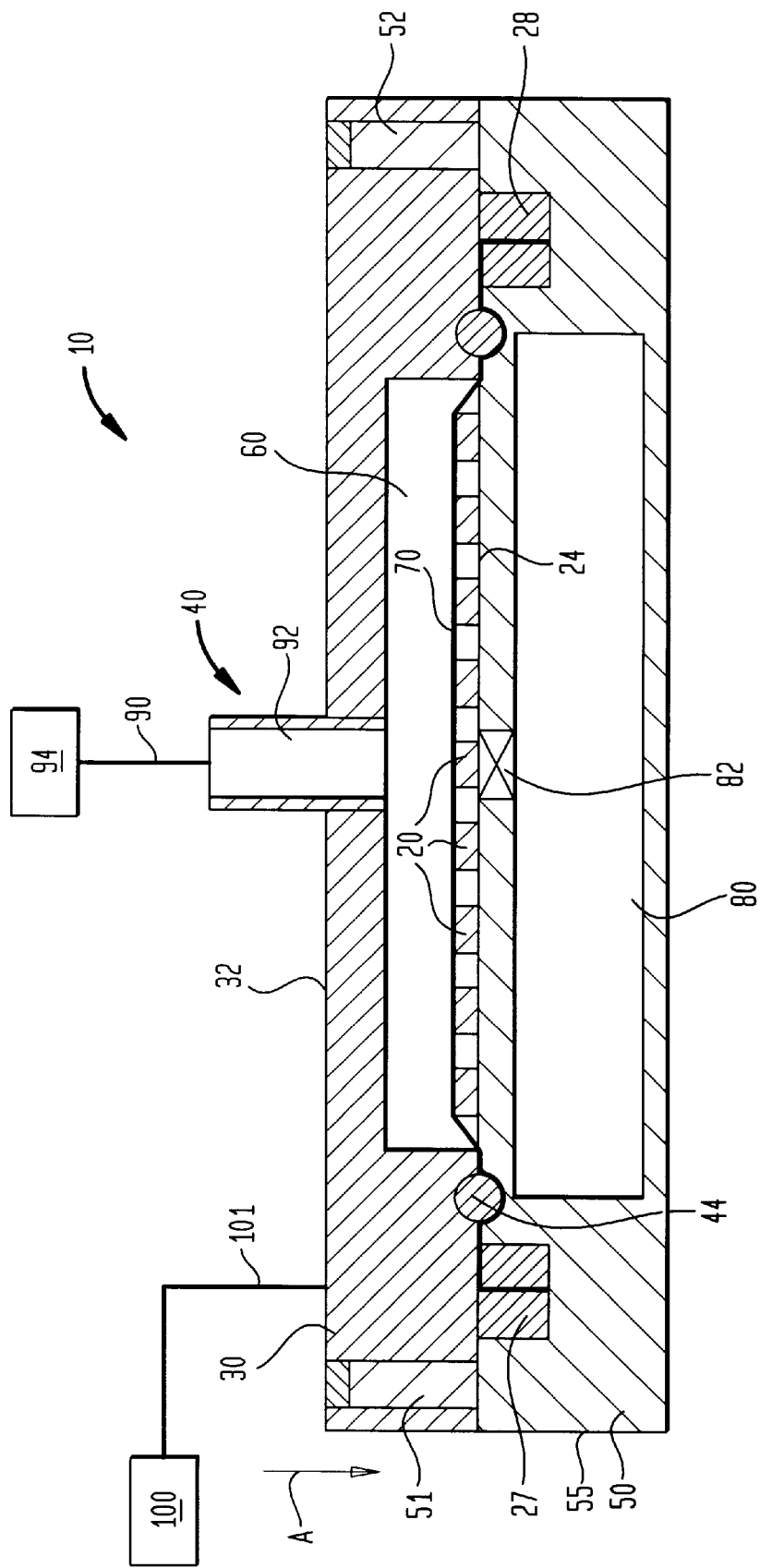
FIG. 2 is another cross-sectional view of the apparatus of FIG. 1, illustrating the apparatus when force is exerted on the laser bars.

A moving apparatus (not shown) is employed to move the mounting film 24, and consequently the laser bars 22, in a direction B with respect to the cover plate 30 and the flexible cover membrane 70. One example of moving apparatus, as shown in FIGS. 1–2, includes hoop ring assemblies 27 and 28 which engage and hold the mounting film 24. The hoop ring assemblies 27 and 28 ride on stepper motors (not shown). Other suitable moving devices may also be used.

As shown in FIG. 1, the laser bars 20 are arranged on the mounting film 24. The top flexible cover membrane (or cover film) 70 is then overlain over the laser bar batch 22 and the hoop assemblies 27, 28 (FIG. 2). The base plate 50 with the heater 80 is positioned beneath the mounting film 24 and the entire assembly is positioned beneath the cover plate 30.

In operation, cover plate 30 moves in the direction of arrow A, as shown in FIG. 2. The cover plate 30 is operated, via a connector 101, by an operations unit 100. The operating unit 100 may be a servo-mechanical device, a hydraulic or pneumatic device, or other structure suitable for moving cover plate 30.

As shown in FIG. 2, once the cover plate 30 moves in the direction of arrow A, allowing the flexible cover membrane 70 to cover the laser bar batch 22 and the hoops 27, 28, a pressurized gas is provided by a source 94 and through the port 40. The gas is input from a supply source 94 through conduit 90 into the sealed chamber 60 through the inlet 92. The pressurized gas may be air or another suitable gas such as nitrogen, carbon dioxide, argon, or helium. The gas source 94 may be, for example, a gas cylinder. The sealing structure 44 and the hold down clamps 51, 52 prevent the gas from escaping from the sealed chamber 60. The inlet 92 may also be fitted with a valve (not shown in the drawings) to prevent the gas 90 from reentering the inlet 92 and leaking from sealed chamber 60.

The pressurized gas 90 in the sealed chamber 60 exerts a uniform pressure over the entire surface of the flexible cover membrane 70. As a consequence, as the flexible cover membrane 70 applies force to the laser bars 20, the laser bars 20 are uniformly pressed against the film 24. The heater 80, built into the base plate 50, heats the mounting film 24 to a desired temperature. The mounting film 24 has the desired adhesion at a specific temperature. Thus, at the specific temperature, laser bars 20 will uniformly adhere to the mounting film layer 24.

The present invention thus provides a method and apparatus for handling laser bars during a fabrication process to uniformly adhere the laser bars to a mounting material. The present method and apparatus may be used to minimize damage to the bars and apply a uniform and constant pressure that, in turn, ensures the uniform adherence of the laser bars to the mounting material. By applying a uniform repeatable isostatic pressure, the pressurized gas is applied to the membrane so that it presses the laser bars against the vinyl film. A heater heats the film so that the laser bars are adhered to the film.

The present invention also provides a method in which uniform pressure is used to mount laser bars on a mounting material. The method includes the steps of positioning the film with the laser bars between a movable cover plate and a stationary base plate, locating the bars between a plastic membrane of the cover plate and the base plate, exerting pressure on the membrane such that the membrane exerts pressure on the laser bars, heating the laser bars, and causing the laser bars to adhere to the film.

While the invention has been described in detail with reference to laser bars, the present invention may be used with other semiconductor products. In addition, the present invention is not limited to the handling of laser bars and the present invention may be used to handle other parts and workpieces, including parts made of other brittle materials. For example, in an alternative embodiment of the invention, the apparatus 10 may be used to uniformly adhere crystalline and noncrystalline, glass, ceramic, or quartz products to a support device. Accordingly, the scope of the present invention is not to be seen as limited by the foregoing description, but is only limited by the scope of the appended claims.

What is claimed as new and desired to be protected by Letters Patent of the United States is:

1. A method of handling laser bars, said method comprising the steps of:

locating a plurality of laser bars on a vinyl film between a supporting structure and a movable structure;

locating flexible membrane between said laser bars and said movable structure;

moving said moveable structure toward said supporting structure to form a sealed chamber containing said vinyl film;

pressurizing said chamber with a gas to exert a force on said laser bars;

heating said vinyl film; and adhering said laser bars to said vinyl film.

2. The method according to claim 1, wherein said chamber is pressurized above atmospheric pressure.

3. The method according to claim 1, wherein said gas is selected from the group consisting of air, carbon dioxide, argon and helium.

4. A method of handling a plurality of laser bars, said method conmprising the steps of:

positioning a moveable member holding said plurality of laser bars on a vinyl film between a supporting structure and said moveable member;

positioning a flexible membrane between said laser bars and said moveable member;

forming a sealed chamber between said moveable member and said supporting structure;

pressurizing said chamber with a gas to exert forces on said plurality of laser bars on said vinyl film; and adhering said plurality of laser bars to said vinyl film.

5. The method according to claim 4, wherein said chamber is pressurized above atmospheric pressure.

6. The method according to claim 4, wherein said film includes polyvinyl chloride.

\* \* \* \* \*